(12) United States Patent
Jain et al.

(10) Patent No.: US 10,103,714 B2
(45) Date of Patent: Oct. 16, 2018

(54) ADJUST VOLTAGE FOR THERMAL MITIGATION

(71) Applicant: QUALCOMM Incorporated, San Diego, CA (US)

(72) Inventors: Palkesh Jain, Bangalore (IN); Manoj Mehrotra, Bangalore (IN); Yuancheng Chris Pan, Saratoga, CA (US); Shih-Hsin Jason Hu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 359 days.

(21) Appl. No.: 15/058,001

(22) Filed: Mar. 1, 2016

(65) Prior Publication Data
US 2017/0257079 A1    Sep. 7, 2017

(51) Int. Cl.
| | |
|---|---|
| *H03K 3/011* | (2006.01) |
| *G06F 1/32* | (2006.01) |
| *G06F 1/20* | (2006.01) |
| *H03K 19/00* | (2006.01) |

(52) U.S. Cl.
CPC ............. *H03K 3/011* (2013.01); *G06F 1/206* (2013.01); *G06F 1/3206* (2013.01); *G06F 1/3234* (2013.01); *G06F 1/3287* (2013.01); *G06F 1/3296* (2013.01); *H03K 19/0016* (2013.01); *Y02D 10/16* (2018.01); *Y02D 10/171* (2018.01); *Y02D 10/172* (2018.01)

(58) Field of Classification Search
CPC ...... G06F 1/206; G06F 1/3206; G06F 1/3234; G06F 1/3287; G06F 1/3296; H03K 3/011
USPC ................. 307/115, 112, 113; 713/300, 320
See application file for complete search history.

(56) References Cited

U.S. PATENT DOCUMENTS

| | | |
|---|---|---|
| 5,502,838 A | 3/1996 | Kikinis |
| 7,721,119 B2 | 5/2010 | Capps et al. |
| 8,120,410 B2 | 2/2012 | Meijer et al. |
| 8,281,164 B2 | 10/2012 | Kim |
| 8,635,470 B1 | 1/2014 | Kraipak et al. |

(Continued)

OTHER PUBLICATIONS

Partial International Search Report—PCT/US2017/016727—ISA/EPO—May 19, 2017.

(Continued)

*Primary Examiner* — Thomas Skibinski
(74) *Attorney, Agent, or Firm* — Arent Fox LLP

(57) ABSTRACT

Apparatuses and methods to adjust voltage for thermal mitigation are provided. The apparatus includes a circuit, a plurality of switches configured to provide power of a power domain to the circuit, a plurality of thermal sensors disposed at different locations about the circuit and configured to detect temperatures at the different locations, and a control circuit configured to determine that one of the detected temperatures at one of the locations exceeds a temperature threshold, and in response, adjust one or more of the plurality of switches in proximity with the one location to reduce power provided to the circuit. The method includes providing power of a power domain through a plurality of switches, detecting a temperature at a location exceeding a temperature threshold, and adjusting the plurality of switches in proximity with the location to reduce the power provided, in response to the detecting the temperature exceeding the temperature threshold.

24 Claims, 6 Drawing Sheets

(56) References Cited

U.S. PATENT DOCUMENTS

| | | |
|---|---|---|
| 8,912,830 B2 | 12/2014 | Conrad et al. |
| 2004/0037346 A1 | 2/2004 | Rusu et al. |
| 2010/0073068 A1* | 3/2010 | Cho .................. G05D 23/1934 327/513 |
| 2013/0173077 A1 | 7/2013 | Ye et al. |
| 2015/0177823 A1 | 6/2015 | Maiyuran et al. |
| 2015/0346745 A1 | 12/2015 | Dasnurkar et al. |
| 2015/0370306 A1* | 12/2015 | Wang ................... G06F 1/3206 713/320 |

OTHER PUBLICATIONS

International Search Report and Written Opinion—PCT/US2017/016727—ISA/EPO—Nov. 15, 2017.

\* cited by examiner

ADJUST VOLTAGE FOR THERMAL MITIGATION

BACKGROUND

Field

The disclosure relates generally to electronic circuits, in particular, to apparatuses and methods to adjust voltage for thermal mitigation.

Background

Increasingly, thermal management is becoming an issue in operating integrated circuits (ICs). For example, wireless communication technologies and devices (e.g., cellular phones, tablets, laptops, etc.) have grown in popularity and use over the past several years. These electronic apparatuses have grown in complexity and now commonly include multiple processors (e.g., baseband processor and application processor) and other resources that allow the users to execute complex and power intensive software applications (e.g., music players, web browsers, video streaming applications, etc.). To meet the increasing performance demand, these processors have increased in complexity and operate in frequencies in the gigahertz range. As a result, substantial heat may be produced while operating these processors.

The heat generated by the processors may adversely affect the performance and the reliability of the device. For example, the performance and reliability of an IC degrade when operating at high temperatures. Moreover, the heat generated by the wireless communication devices must be within a limit tolerated by the users. Thus, one design challenge is providing the thermal mitigation functions to manage the heat issue.

SUMMARY

Aspects of a method to adjust voltage for thermal mitigation are provided. The method includes providing power of a power domain through a plurality of switches, detecting a temperature at a location exceeding a temperature threshold, and adjusting the plurality of switches in proximity with the location to reduce power provided, in response to the detecting the temperature exceeding the temperature threshold.

Aspects of an apparatus are disclosed. The apparatus includes a circuit, a plurality of switches configured to provide power of a power domain to the circuit, a plurality of thermal sensors disposed at different locations about the circuit and configured to detect temperatures at the different locations, and a control circuit configured to determine that one of the detected temperatures at one of the locations exceeds a temperature threshold, and in response, adjust one or more of the plurality of switches in proximity with the one location to reduce power provided to the circuit.

Aspects of another apparatus are provided. The apparatus includes a first core and a second core sharing a power domain. The first core is configured to operate at a first voltage of a voltage domain, and the second core is configured to operate at a second voltage of the voltage domain. A control circuit is configured to independently adjust each of the first and second voltages of the voltage domain for thermal mitigation.

Aspects of another method to adjust voltage for thermal mitigation are provided. The method includes providing power to a first core and a second core sharing a power domain, operating the first core at a first voltage of a voltage domain, operating the second core at a second voltage of the voltage domain, and adjusting independently each of the first and second voltages of the voltage domain for thermal mitigation.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

DETAILED DESCRIPTION

Figure 1:
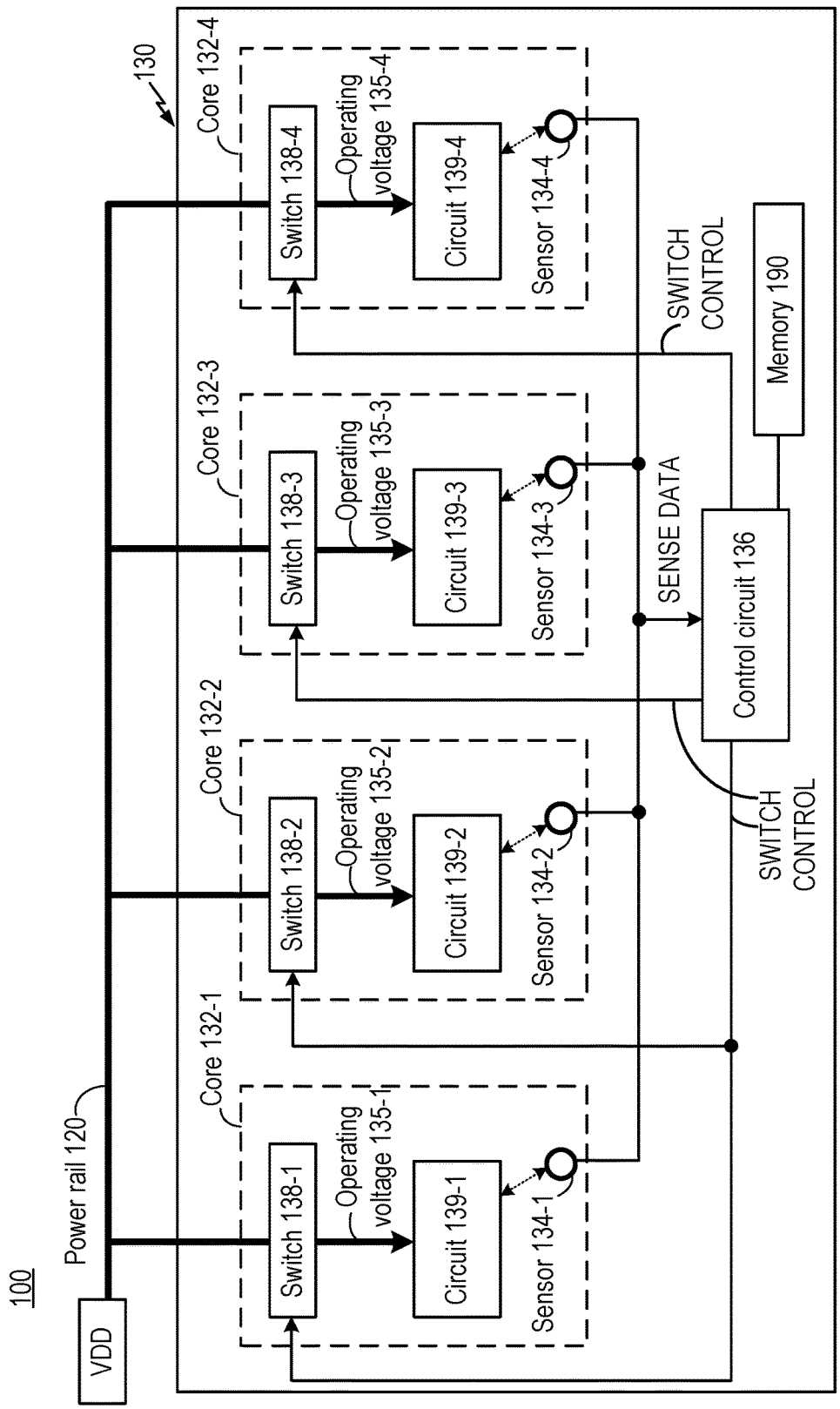
FIG. 1 is a block diagram of an exemplary embodiment of an apparatus to adjust voltage for thermal mitigation.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

The term "apparatus" shall be construed to include any integrated circuit or system, or any portion of an integrated circuit or system (e.g., modules, components, circuits, or the like residing in an integrated circuit or part of an integrated circuit). The term "apparatus" shall also be construed to include any intermediate product where an integrated circuit or system is combined with other integrated circuits or systems (e.g., a video card, a motherboard, a circuit board, etc.) or any end product (e.g., mobile phone, personal digital assistant (PDA), desktop computer, laptop computer, palm-sized computer, tablet computer, work station, game console, media player, computer based simulators, or the like). The term "method" shall similarly be construed to include the operation of any integrated circuit or system, or any portion of an integrated circuit or system, or any intermediate product or end product, or any step, process, algorithm, or the like, or any combination thereof performed by such integrated circuit or system (or portion thereof), intermediate product, or end product.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element. A reference to a signal may be referred to the underlying signal line (e.g., a metal line on an IC) carrying the signal. A reference to a resistor may likewise be used to refer to the resistance of said resistor.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of the stated features, integers, steps, operations, elements, and/or components, but do not preclude the presence or addition of one or more other features, integers, steps, operations, elements, components, and/or groups thereof.

Various aspects of apparatuses and methods to adjust voltage for thermal mitigation will be presented with respect to a processor IC for wireless communication and/or to a wireless communication system incorporating the processor IC. However, as those skilled in the art will readily appreciate, the various aspects of methods and apparatus to adjust voltage for thermal mitigation presented throughout this disclosure and their numerous applications are not limited thereto. For example, the aspects presented may be applicable to ICs other than a processor and applicable to functions beyond wireless communication. Accordingly, all references to a specific application for the presented apparatus or method are intended only to illustrate exemplary aspects of the apparatus or method with the understanding that such aspects may have a wide differential of applications.

FIG. 1 is a block diagram 100 of an exemplary embodiment of an apparatus to adjust voltage for thermal mitigation. In some examples, the exemplary embodiment apparatus may be a processor 130 for wireless communication or a board or a device (e.g., a cell phone) incorporating the processor 130. The processor 130 may be on one or several semiconductor substrates and packages. The processor 130 may include cores 132 (132-1-132-4), sensors 134 (134-1 to 134-4), a control circuit 136, and a memory 190.

In some examples, a core may be a collection of circuit. In another example, a core may be a processor core or a central processing unit (CPU). Thus, each of the cores 132 includes the circuit 139 (139-1-139-4). The cores 132 are powered by a power rail 120 and accordingly, the cores 132 share the power domain. The power rail 120 provides a supply voltage VDD to the cores 132 (e.g., circuits 139). The supply voltage may be provided by, for example, a power management IC (PMIC) (not shown for clarity). Accordingly, the cores 132 (e.g., circuits 139) are configured to operate in a voltage domain. A voltage domain may, for example, include one or more operating voltages in addition to ground. In some examples, the one or more operating voltages may be close in value such that the cores 132 (e.g., circuits 139) configured to operate in the one voltage domain may function properly.

Within the cores 132, the circuits 139 receive power from the power rail 120 through the switches 138 (138-1-138-4). In this fashion, the circuits 139 receive operating voltages 135 (135-1-135-4) through the switches 138. The types of switches 138 are not particularly limiting. In some examples, the switches 138 may include transistors such as P-type transistors or N-type transistors. In some examples, the switches 138 may broadly include suitable circuits to provide power to the circuits 139.

In some examples, the sensors 134 and the control circuit 136 may be incorporated as part of one of the cores 132. In some other examples, the sensors 134 and the control circuit 136 may be external to the substrates of the processor 130. In some examples, the sensors 134 include thermal sensors that detect temperatures associated with cores 132. In some examples, the sensor 134 may further include performance sensors, such as a ring oscillator, which detect the performance levels of the cores 132.

The sensors 134 output the sensor data via the SENSOR DATA signal to the control circuit 136. The control circuit 136 controls the switches 138 via the SWITCH-CONTROL signaling. In some examples, the control circuit 136 may determine from the received SENSOR DATA signal that one of the detected temperatures exceeds a predetermined temperature threshold. In response, the control circuit 136 may control (e.g., adjust) the corresponding switch 138 via the SWITCH-CONTROL signaling to adjust the operating voltage 135. The control circuit 136 may interface with the memory 190 for information to perform the voltage adjustment. In such fashion, the processor 130 may control the switch 138 to adjust the operating voltages 135 for thermal mitigation. For example, as the operating voltage 135 is lowered, the heat generated by the circuit 139 may be reduced (even accounting for the increased power through the switch 138). Additional features of the voltage adjustment are provided hereafter.

Figure 2:
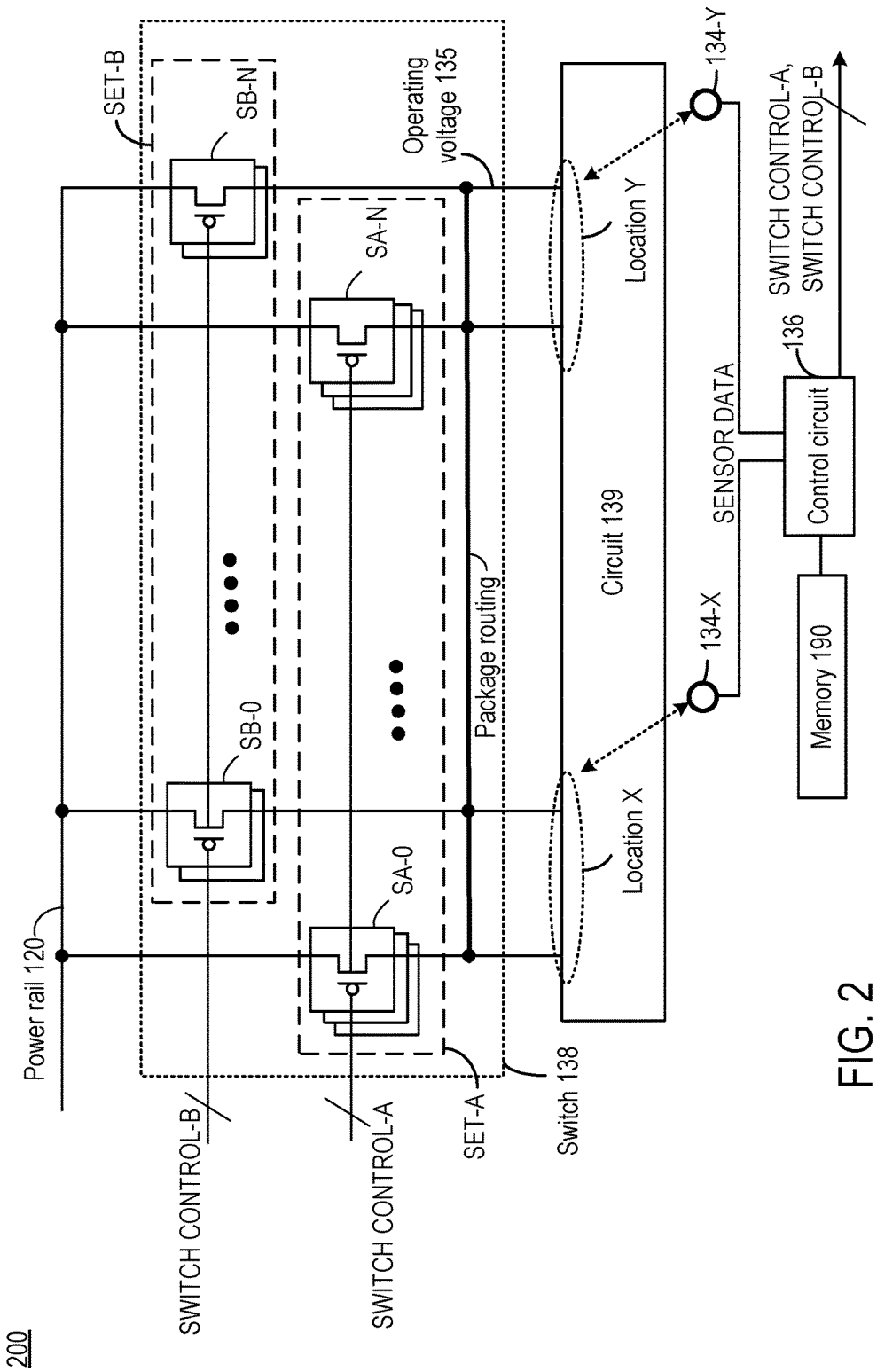
FIG. 2 is a block diagram of an exemplary embodiment of the switches of the apparatus of FIG. 1 configured to adjust voltage for thermal mitigation based on physical locations.

FIG. 2 is a block diagram 200 of an exemplary embodiment of the switches of the apparatus of FIG. 1 configured to adjust voltage for thermal mitigation based on physical locations. The switch 138 includes a plurality of unit switches arranged as various groups including SB-0 to SB-N and SA-0 to SA-N. Each of the groups (SB-0 to SB-N and SA-0 to SA-N) may include multiple unit switches. In some examples, the unit switches (e.g., groups SB-0 to SB-N and SA-0 to SA-N) are arranged in parallel. A terminal of the unit switches may be connected to the power rail 120, and the other terminal of the unit switches may be connected via package routing to provide the operating voltage 135. In some examples, the package routing provides a routing plane over the semiconductor substrates (e.g., the cores 132) and enables any of the unit switches among the groups SB-0 to SB-N and SA-0 to SA-N to be placed in any locations within the cores 132. Some of the unit switches may be in proximity with a sensor 134. The circuit 139 is connected to the package routing to receive the operating voltage 135.

The sensors 134, for example thermal sensors, may be placed at various locations within or about a core 132. FIG. 2 illustrates the sensor 134-X at location X and the sensor 134-Y at location Y. In some examples, the sensors 134 may be placed on "hot spots" within or about a core 132. For example, through simulation, various locations or hot spots which are likely to generate the most heat may be located, and the sensors 134 may be placed at or about those locations. The unit switches among the groups SB-0 to SB-N and SA-0 to SA-N may then be placed within proximity of the sensors 134. In some examples, unit switches are in proximity with a sensor 134 if those unit switches are the closest to the sensor 134 or within a range (e.g., distance) of the sensor 134. The association of the unit switches and the sensors 134 may be stored within the memory 190.

By way of an example, the sensor 134-X detects temperatures at location X of the circuit 139, and the sensor 134-Y detects temperatures at location Y of the circuit 139. The sensors 134-X and 134-Y provide the detected temperatures to the control circuit 136 via the SENSOR DATA signal. The control circuit 136 may determine that the temperature detected at location X by the sensor 134-X exceeds a predetermined temperature threshold. The temperature thresholds may vary with the locations and operations of the circuit 139 and may be programmable or changed by software instructions. For example, if the core 132 is engaging in a high-performance, mission critical operation, the temperature threshold may be raised. These temperature thresholds may be stored in the memory 190.

In response to detecting the temperature at location X exceeding a threshold, the control circuit 136 may control the unit switches in proximity with the location X. For example, the control circuit 136 may access the memory 190 to determine the unit switches in proximity with the location X. In some examples, the control circuit 136 may determine a number of unit switches that are closest to the location X. In some other examples, the unit switches in proximity may be those within a distance range of the location X. In some other examples, the unit switches in proximity with a location may be defined by information stored in the memory 190.

For example, the control circuit 136 may determine that unit switches in groups SA-0 and SB-0 are in proximity of the location X using the schemes described above. In response, the control circuit 136 may control the unit switches in group SA-0 and SB-0 to adjust the operating voltage 135 at the location X using the SWITCH CONTROL signals (e.g., SWITCH CONTROL-A, SWITCH CONTROL-B). In some examples, the control circuit 136 may adjust the resistance of the unit switches in group SA-0 and SB-0 in proximity with location X. For examples, the SWITCH CONTROL signals may turn each of the unit switches ON (providing power to the circuit 139) and OFF (disconnecting power from the circuit 139), and the control circuit 136 may turn off a number of unit-switches in group SA-0 and SB-0 to increase the resistance of the unit switches using the SWITCH CONTROL signals. In such fashion, the operating voltage at the location X may be reduced based on the number of the unit-switches in group SA-0 and SB-0 being turned off.

In this regard, the numbers of the unit switches associated with each of the locations (e.g., in proximity) to turn off may be predetermined and stored in the memory 190. For example, the memory 190 may store a plurality of predetermined settings for the group SA-0 and SB-0 of the location X. Each of the predetermined settings may indicate a number of the unit switches of the group SA-0 and SB-0 and the resulting reduced operating voltage 135 at the location X. In some examples, the predetermined settings (e.g., the numbers of the unit switches to turn off) may include one that results in an operating voltage threshold at the operating voltage 135. An operating voltage threshold may be a minimum operating voltage at which a circuit may still perform satisfactorily in view of an operation or operating mode of the circuit and/or a temperature of the circuit. The predetermined settings may further be stored based on temperatures of the circuit (e.g., at location X).

The unit switches may further be arranged into sets SET-A and SET-B. For example, the set SET-A may include the groups SA-0 to SA-N, and the SET-B may include the groups SB-0 to SB-N. In some examples, all the unit switches may be turned on at once to power up the core 132 (e.g., circuit 139), and all the unit switches may be turned off at once to power down the core 132 or the circuit 139. However, in doing so, the inrush current spike may cause an unacceptable drop in the operating voltage 135. In some examples, the control circuit 136 may be configured to use the SWITCH CONTROL signals to operate the unit switches as a set (SET-A or SET-B). For example, the control circuit 136 may use the SWITCH CONTROL signals to turn on the set SET-A of unit switches first to power up the core 132 (e.g., circuit 139), and then turn on the set SET-B of unit switches after a delay. Similar control and delay may be applied to power down the core 132 (e.g., circuit 139). In such fashion, the inrush current in a power up or power down process may be spread over time so as not to spike to an unacceptable level.

Figure 3:
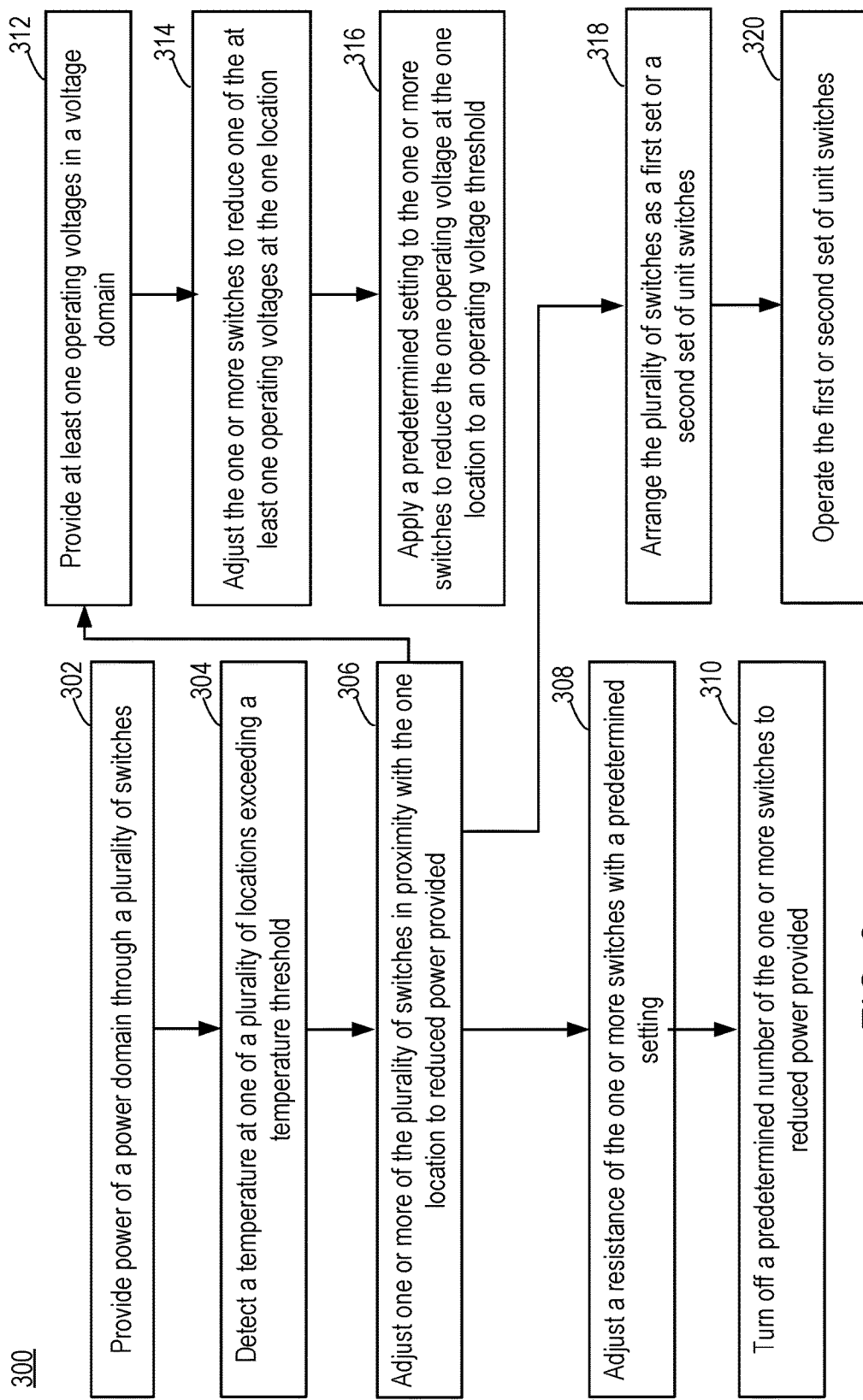
FIG. 3 is a flowchart of operations to adjust voltage for thermal mitigation.

FIG. 3 is a flowchart 300 of operations to adjust voltage for thermal mitigation. In some examples, the flowchart 300 may be performed by the processor 130 (see FIG. 1 and FIG. 2)(e.g., by the control circuit 136). At 302, power of a power domain is provided through a plurality of switches. Referring to FIG. 1, a plurality of switches 138 are configured to provide power of a power domain, received from the power rail 120, to the circuit 139 within a core 132.

At 304, a temperature at one of a plurality of locations is detected to exceed a temperature threshold. For example, referring to FIG. 2, multiple sensors 134 are disposed at locations X and Y about the circuit 139 (e.g., around the circuit 139) and are configured to detect temperatures at the locations X and Y. The sensors 134 output the detected temperatures to the control circuit 136 via the SENSOR DATA signal. By way of an example, the sensor 134-X detects temperatures at location X of the circuit 139, and the sensor 134-Y detects temperatures at location Y of the circuit 139. The sensors 134-X and 134-Y provide the detected temperatures to the control circuit 136 via the SENSOR DATA signal. The control circuit 136 may determine that the temperature detected at location X by the sensor 134-X exceeds a predetermined temperature threshold. The temperature thresholds may vary with the locations and operations of the circuit 139 and may be programmable or changed by software instructions. For example, if the core 132 is engaging a high-performance, mission critical operation, the temperature threshold may be raised. These temperature thresholds may be stored in the memory 190.

At 306, one or more of the plurality of switches in proximity with the one location are adjusted to reduce power provided. For example, referring to FIG. 2, the control circuit 136 may adjust one or more of the switches 138 in proximity with the one location (e.g., at location X in the example) to reduce power provided to the circuit 139.

For example, in response to the detection of 304, the circuit 136 may control the switch 138 in proximity with the location X via the SWITCH-CONTROL signaling to adjust the operating voltage 135. The control circuit 136 may interface with the memory 190 for information to perform the voltage adjustment. The unit switches of the switch 138 among the groups SB-0 to SB-N and SA-0 to SA-N may be placed within proximity of the sensors 134. In some examples, unit switches are in proximity with a sensor 134 if those unit switches are the closest to the sensor 134 or within a range of the sensor 134. The association of the unit switches and the sensors 134 may be stored within the memory 190.

In response to detecting the temperature at location X exceeding a threshold, the control circuit 136 may control the unit switches in proximity with the location X. For example, the control circuit 136 may access the memory 190 to determine the unit switches in proximity with the location X. In some examples, the control circuit 136 may determine a number of unit switches that are closest to the location X. In some other examples, the unit switches in proximity may be those within a distance range of the location X. In some other examples, the unit switches in proximity with a location may be defined by information stored in the memory 190.

At 308, a resistance of the one or more switches is adjusted with a predetermined setting. For example, the control circuit 136 may be configured to adjust a resistance of the one or more switches 138 with a predetermined setting to reduce power provided to the circuit 139. The control circuit 136 may adjust the resistance of the unit switches in group SA-0 and SB-0 in proximity with location X. For example, the SWITCH CONTROL signals may turn each of the unit switches ON (providing power to the circuit 139) and OFF (disconnecting power from the circuit 139), and the control circuit 136 may turn off a number of unit-switches in group SA-0 and SB-0 to increase the resistance of the unit switches using the SWITCH CONTROL signals. In such fashion, the operating voltage at the location X may be reduced based on the number of the unit-switches in group SA-0 and SB-0 being turned off.

In this regard, the numbers of the unit switches associated with each of the locations (e.g., in proximity) to turn off (for adjusting a resistance of the switches 138) may be predetermined and stored in the memory 190. For example, the memory 190 may store a plurality of predetermined settings for the group SA-0 and SB-0 of the location X. Each of the predetermined settings may indicate a number of the unit switches of the group SA-0 and SB-0 and the resulting reduced operating voltage 135 at the location X. In some examples, the predetermined settings (e.g., the numbers of the unit switches to turn off) may include one that results in an operating voltage threshold at the operating voltage 135. An operating voltage threshold may be a minimum operating voltage at which a circuit may still perform satisfactorily in view of an operation or operating mode of the circuit and/or a temperature of the circuit. The predetermined settings may further be stored based on temperatures of the circuit (e.g., at location X).

At 310, a predetermined number of the one or more switches may be turned off to reduce power provided. For example, the control circuit 136 is configured to turn off a predetermined number of the one or more switches 138 to reduce power provided to the circuit 139. For example, the SWITCH CONTROL signals may turn each of the unit switches ON (providing power to the circuit 139) and OFF (disconnecting power from the circuit 139), and the control circuit 136 may turn off a number of unit-switches in group SA-0 and SB-0 to increase the resistance using the SWITCH CONTROL signals. In such fashion, the operating voltage (e.g., power) at the location X may be reduced based on the number of the unit-switches in group SA-0 and SB-0 being turned off.

In this regard, the numbers of the unit switches associated with each of the locations (e.g., in proximity) to turn off may be predetermined and stored in the memory 190. For example, the memory 190 may store a plurality of predetermined settings for the group SA-0 and SB-0 of the location X. Each of the predetermined setting may indicate a number of the unit switches of the group SA-0 and SB-0 and the resulting reduced operating voltage 135 at the location X. In some examples, the predetermined settings (e.g., the numbers of the unit switches to turn off) may include one that results in an operating voltage threshold at the operating voltage 135. An operating voltage threshold may be a minimum operating voltage at which a circuit may still perform satisfactorily in view of an operation or operating mode of the circuit and/or a temperature of the circuit. The predetermined settings may further be stored based on temperatures of the circuit (e.g., at location X).

At 312, at least one operating voltages is provided in a voltage domain. For example, the switches 138 are configured to provide at least one operating voltage 135 in a voltage domain to the circuit. Referring to FIG. 1, for example, the power rail 120 provides a supply voltage VDD to the cores 132 (e.g., circuits 139). The supply voltage may be provided by, for example, a PMIC. Accordingly, the cores 132 (e.g., circuits 139) are configured to operate in a voltage domain. A voltage domain may, for example, include one or more operating voltages in addition to ground. In some examples, the one or more operating voltages 135 may be close in value such that the cores 132 (e.g., circuits 139) configured to operate in the one voltage domain may function properly.

At 314, the one or more switches are adjusted to reduce one of the at least one operating voltages at the one location. For example, the control circuit 136 may be configured to adjust the switches 138 to reduce one of the at least one operating voltages 135 at the one location (e.g., location X where the detected temperature exceeds a temperature threshold). The control circuit 136 may adjust the resistance of the unit switches in group SA-0 and SB-0 in proximity with location X. For example, the SWITCH CONTROL signals may turn each of the unit switches ON (providing power to the circuit 139) and OFF (disconnecting power from the circuit 139), and the control circuit 136 may turn off a number of unit-switches in group SA-0 and SB-0 to increase the resistance of the unit switches using the SWITCH CONTROL signals. In such fashion, the operating voltage at the location X may be reduced based on the number of the unit-switches in group SA-0 and SB-0 being turned off.

In this regard, the numbers of the unit switches associated with each of the locations (e.g., in proximity) to turn off (for adjust a resistance of the switches 138) may be predetermined and stored in the memory 190. For example, the memory 190 may store a plurality of predetermined settings for the group SA-0 and SB-0 of the location X. Each of the predetermined setting may indicate a number of the unit switches of the group SA-0 and SB-0 and the resulting reduced operating voltage 135 at the location X. In some examples, the predetermined settings (e.g., the numbers of the unit switches to turn off) may include one that results in an operating voltage threshold at the operating voltage 135.

An operating voltage threshold may be a minimum operating voltage at which a circuit may still perform satisfactorily in view of an operation or operating mode of the circuit and/or a temperature of the circuit. The predetermined settings may further be stored based on temperatures of the circuit (e.g., at location X).

At 316, a predetermined setting may be applied to the one or more switches to reduce the one operating voltage at the one location to an operating voltage threshold. For example, the control circuit 136 may be configured to adjust the switches 138 to reduce the one operating voltage 135 at the one location (e.g., location X where the detected temperature exceeds a temperature threshold) to an operating voltage threshold in accordance with a predetermined setting.

For example, the numbers of the unit switches associated with each of the locations (e.g., in proximity) to turn off may be predetermined and stored in the memory 190. For example, the memory 190 may store a plurality of predetermined settings for the group SA-0 and SB-0 of the location X. Each of the predetermined settings may indicate a number of the unit switches of the group SA-0 and SB-0 and the resulting reduced operating voltage 135 at the location X. In some examples, the predetermined settings (e.g., the numbers of the unit switches to turn off) may include one that results in an operating voltage threshold at the operating voltage 135. An operating voltage threshold may be a minimum operating voltage at which a circuit may still perform satisfactorily in view of an operation or operating mode of the circuit and/or a temperature of the circuit. The predetermined settings may further be stored based on temperatures of the circuit (e.g., at location X).

At 318, the plurality of switches may be arranged as a first set or a second set of unit switches. For example, referring to FIG. 2, the switches 138 are arranged as the sets SET-A and SET-B. For example, the set SET-A may include the groups SA-0 to SA-N, and the SET-B may include the groups SB-0 to SB-N.

At 320, the first or second set of unit switches is operated. In some examples, all the unit switches may be turned on at once to power up the core 132 (e.g., circuit 139) and, all the unit switches may be turned off at once to power down the core 132 or the circuit 139. However, in doing so, the inrush current may spike cause an unacceptable drop in the operating voltage 135. In some examples, the control circuit 136 may be configured to use the SWITCH CONTROL signals to operate the unit switches as a set (SET-A or SET-B). For example, the control circuit 136 may use the SWITCH CONTROL signals to turn on the set SET-A of unit switches first to power up the core 132 (e.g., circuit 139), and then turn on the set SET-B of unit switches after a delay. Similar control and delay may be applied to power down the core 132 (e.g., circuit 139). In such fashion, the inrush current in a power up or power down process may be spread over time so as not to spike to an unacceptable level.

Figure 4A:
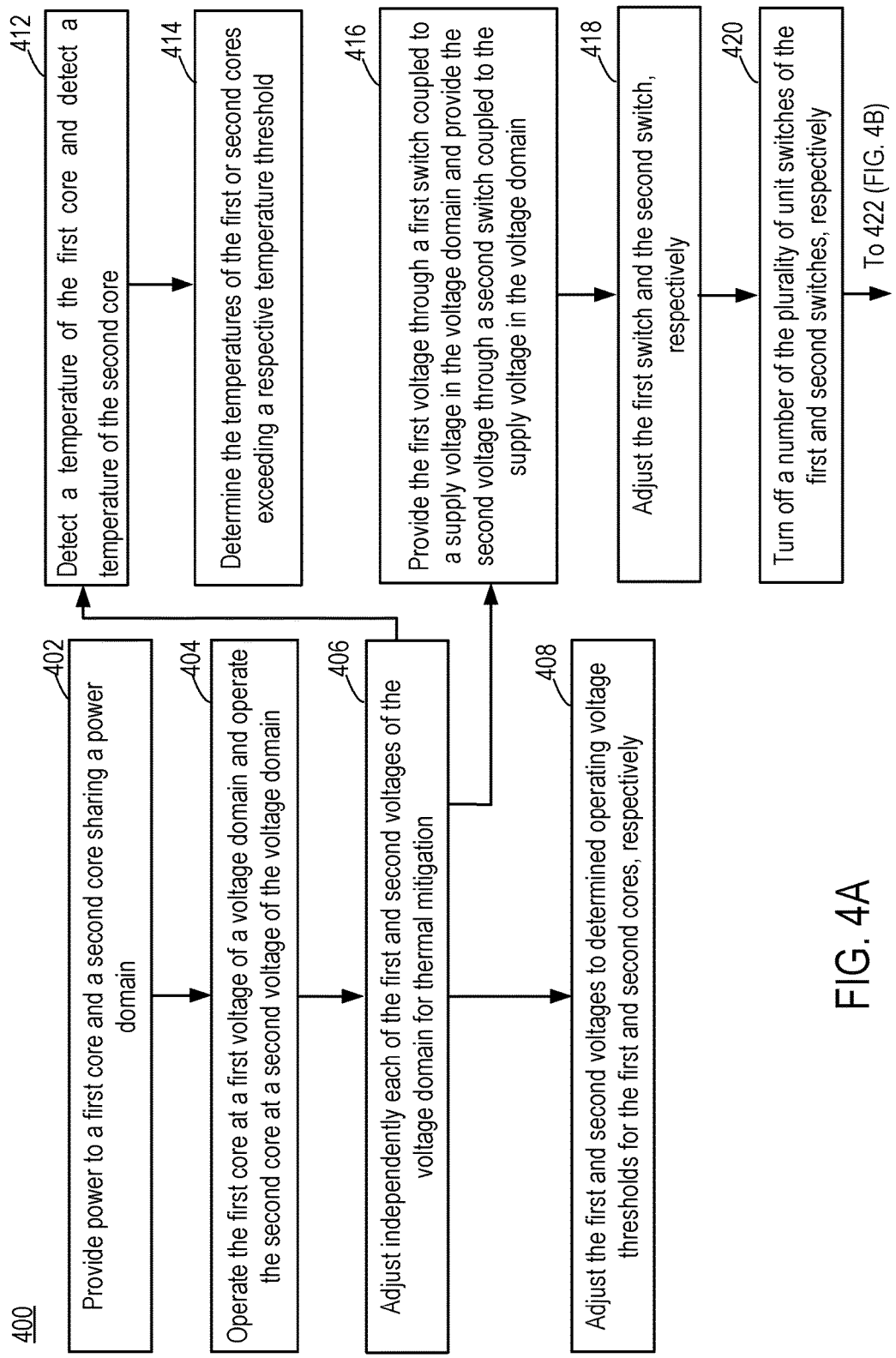
FIGS. 4A and 4B are another flowchart of operations to adjust voltage for thermal mitigation.
Figure 4B:
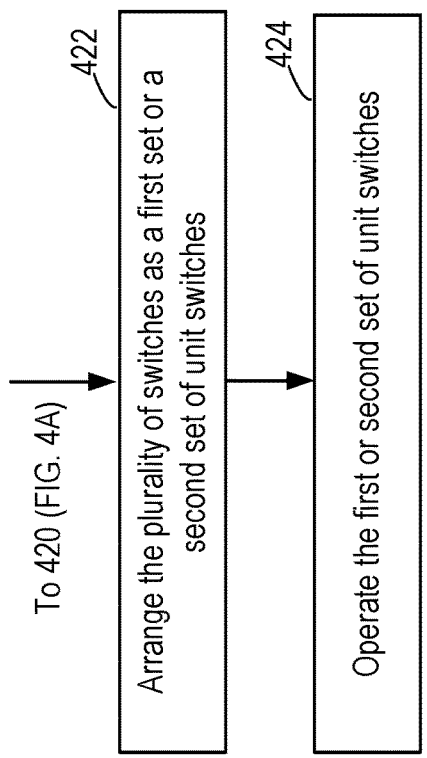

FIGS. 4A and 4B are another flowchart 400 of operations to adjust voltage for thermal mitigation. In some examples, the flowchart 400 may be performed by the processor 130 (see FIG. 1 and FIG. 2)(e.g., by the control circuit 136). At 402, power is provided to a first core and a second core sharing a power domain. Referring to FIG. 1, the cores 132-1 to 132-4 are powered by the power rail 120 and thus, share a power domain.

At 404, the first core is operated at a first voltage of a voltage domain and the second core is operated at a second voltage of the voltage domain. Referring to FIG. 1, for example, each of the cores 132-1 to 132-4 may operate at an operating voltage 135 of a voltage domain. The power rail 120 provides a supply voltage VDD to the cores 132 (e.g., circuits 139). The supply voltage may be provided by, for example, a PMIC. Accordingly, the cores 132 (e.g., circuits 139) are configured to operate in a voltage domain. A voltage domain may, for example, include one or more operating voltages in addition to ground. In some examples, the one or more operating voltages 135 may be close in value such that the cores 132 (e.g., circuits 139) configured to operate in the one voltage domain may function properly.

At 406, each of the first and second voltages of the voltage domain is adjusted independently for thermal mitigation. For example, referring to FIG. 1, the control circuit 136 may be configured to independently adjust each of the first and second voltages (e.g., 135-1 and 135-2) of the voltage domain for thermal mitigation. By way of an example, in a case that the control circuit 136 detects a temperature of the core 132-1 exceeds a temperature threshold, the control circuit 136 may adjust the operating voltage 135-1 of the core 132-1 independently of the operating voltage 135-2 of the core 132-2.

At 408, the first and second voltages are adjusted to operating voltage thresholds for the first and second cores, respectively. For example, the control circuit 136 may adjust each of the operating voltage 135 of the core 132 to an operating voltage threshold. An operating voltage threshold may be a minimum operating voltage at which a circuit may still perform satisfactorily in view of an operation or operating mode of the circuit and/or a temperature of the circuit.

At 412, a temperature of the first core is detected and a temperature of the second core is detected. For example, referring to FIG. 1, the sensor 134-1 may detect a temperature of the core 132-1, and the sensor 134-2 may detect a temperature of the core 132-2. The sensors (134-1 and 134-2 in this example) provide the detected temperature via the SENSOR DATA signal to the control circuit 136.

At 414, the temperature of the first or second cores is determined to exceed a temperature threshold. In some examples, the control circuit 136 may determine from the received SENSOR DATA signal that one of the detected temperatures exceed a predetermined temperature threshold. By way of an example, the control circuit 136 may determine that the temperature of core 132-1 detected by the sensor 134-1 exceeds a predetermined temperature threshold. The temperature thresholds may vary with the locations and operations of the circuit 139 and may be programmable or changed by software instructions. For example, if the core 132-1 is engaging a high-performance, mission critical operation, the temperature threshold may be raised. These temperature thresholds may be stored in the memory 190.

At 416, the first voltage is provided through a first switch coupled to a supply voltage in the voltage domain and the second voltage is provided through a second switch coupled to the supply voltage in the voltage domain. Referring to FIG. 1, for example, the operating voltage 135-1 is provided to the circuit 139-1 of the core 132-1 through the switch 138-1. The switch 138-1 is coupled to the supply voltage VDD by the power rail 120. The operating voltage 135-2 is provided to the circuit 139-2 of the core 132-2 through the switch 138-2. The switch 138-2 is coupled to the supply voltage VDD by the power rail 120.

At 418, the first switch and the second switch are adjusted, respectively. For example, the control circuit 136 may adjust one or more of the switches 138 to reduce power provided to the circuit 139 in response to detecting a temperature exceeding a temperature threshold (e.g., thermal mitigation).

By way of an example, the control circuit 136 may determine from the received SENSOR DATA signal that one of the detected temperatures of the core 132-1 and the core 132-2 exceeds a predetermined temperature threshold. For example, the control circuit 136 may determine that the temperature of core 132-1 detected by the sensor 134-1 exceeds a predetermined temperature threshold. In response, the circuit 136 may control the switch 138-1 of the core 132-1 via the SWITCH-CONTROL signaling to adjust the switch 138-1 and therefore, the operating voltage 135.

At 420, a number of the plurality of unit switches of the first and second switches is turned off, respectively. For example, the control circuit 136 may control the switch 138-1 of the core 132-1 via the SWITCH-CONTROL signaling to adjust the switch 138-1 and therefore, the operating voltage 135, for thermal mitigation. For example, the control circuit 136 may be configured to turn off a predetermined number of the one or more switches 138-1 to reduce power provided to the circuit 139-1. For examples, the SWITCH CONTROL signals may turn each of the unit switches ON (providing power to the circuit 139-1) and OFF (disconnecting power from the circuit 139-1), and the control circuit 136 may turn off a number of unit-switches in group SA-0 and SB-0 to increase the resistance of the switch 138-1 using the SWITCH CONTROL signals. In such fashion, the operating voltage (e.g., power) of the core 132 may be reduced based on the number of the unit-switches in group SA-0 and SB-0 being turned off.

At 422, the plurality of switches may be arranged as a first set or a second set of unit switches. For example, referring to FIG. 2, the unit switches of the switches 138 are arranged as the sets SET-A and SET-B. For example, the set SET-A may include the groups SA-0 to SA-N, and the SET-B may include the groups SB-0 to SB-N.

At 424, the first or second set of unit switches is operated. In some examples, all the unit switches may be turned on at once to power up the core 132 (e.g., circuit 139) and, all the unit switches may be turned off at once to power down the core 132 or the circuit 139. However, in doing so, the inrush current may spike cause an unacceptable drop in the operating voltage 135. In some examples, the control circuit 136 may be configured to use the SWITCH CONTROL signals to operate the unit switches as a set (SET-A or SET-B). For example, the control circuit 136 may use the SWITCH CONTROL signals to turn on the set SET-A of unit switches first to power up the core 132 (e.g., circuit 139), and then turn on the set SET-B of unit switches after a delay. Similar control and delay may be applied to power down the core 132 (e.g., circuit 139). In such fashion, the inrush current in a power up or power down process may be spread over time so as not to spike to an unacceptable level.

Figure 5:
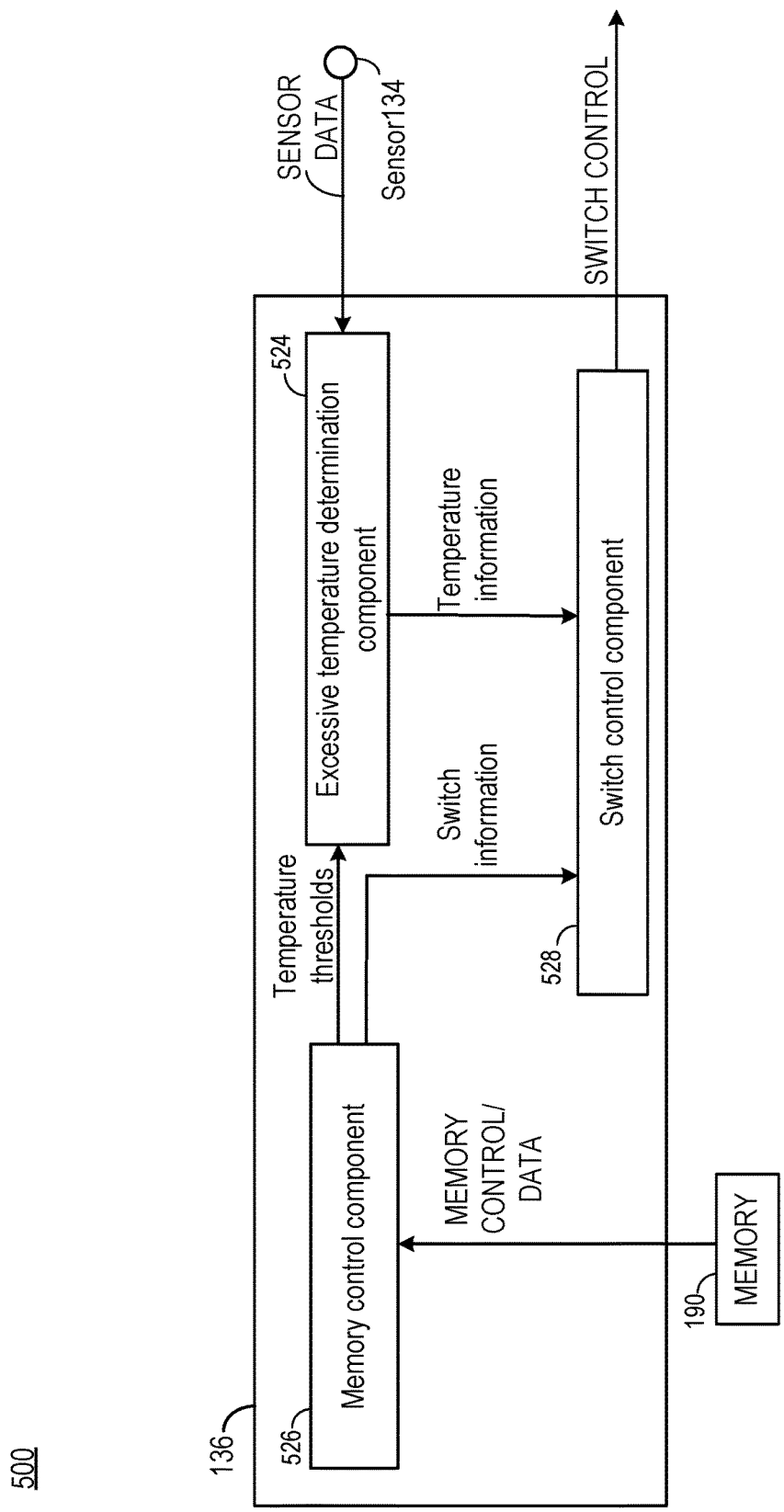
FIG. 5 is a block diagram of an exemplary embodiment of a control circuit.

FIG. 5 is a block diagram 500 of an exemplary embodiment of a control circuit. The control circuit 136 may perform the various functions described with the flowcharts 300 and 400. The control circuit 136 may be an exemplary embodiment of a hardware implementation of the control circuit and may include various (e.g., hardware and/or software) components. The control circuit 136 may be part of processor 130 or external to the processor 130, either in whole or part. To the extent that the control circuit 136, or any portion thereof, is implemented external to the processor, it may be implemented in any part of a device or a board incorporating the processor 130. In some examples, each of device or a board may include part or all of the components described below, as would be understood by persons of ordinary skills in the art.

In an exemplary embodiment, the control circuit 136 and the components contained therein, presented below, may include circuits, processor or processors, software executing on the processor or processors, or combinations thereof. These components may include circuits for generating the signals for the functions described infra or signal lines carrying those signals.

By way of example, a component, or any portion of a component, or any combination of components may be implemented with one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

The control circuit 136 may include, in whole or in part, the excessive temperature determination component 524, the memory control component 526, and the switch control component 528. The excessive temperature determination component 524 may monitor the temperatures detected by the sensor 134 via the SENSOR DATA signal. The excessive temperature determination component 524 may compare the detected temperatures with temperature thresholds stored in the memory 190 (received from the memory control component 526).

The memory control component 526 may interface with the memory 190 via the MEMORY CONTROL/DATA signal for information stored in the memory 190. For example, the memory control component 526 may read from the memory 190 the temperature thresholds for each sensor 134, the switches 138 associated with each of the sensor 134, and predetermined settings of the switches 138.

The switch control component 528 may adjust the switches 138 to reduce power (e.g., by reducing the operating voltage 135). The switch control component 528 may receive the temperature information from the excessive temperature determination component 524. The temperature information may include the core 132, the location of the sensor 134, and the detected temperature. The switch control component 528 may receive the switch information stored in the memory 190 from the memory control component 526. The switch information may include the switches 138 associated with the sensor 134 detecting the temperature exceeding the temperature threshold and the predetermined settings of the switches 138. The switch control component 528 may generate the SWITCH CONTROL signals to adjust the setting on the switches 138 (e.g., turn off a number of the unit switches in accordance with the predetermined settings). In some examples, the switch control component 528 may further generate the SWITCH CONTROL signals to control the switches 138 as SET-A or SET-B in a power-up (or power-down) event.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented. The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims. For example, the steps may be implemented by circuits to perform the functions described herein and/or circuits generating the signals for the functions described herein, or combinations thereof.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), unless the element is expressly recited using the phrase "means for" or, in the case of a method claim, the element is recited using the phrase "step for."

What is claimed is:

1. An apparatus, comprising:
   a circuit;
   a plurality of switches configured to provide power of a power domain to the circuit;
   a plurality of thermal sensors disposed at different locations about the circuit and configured to detect temperatures at the different locations; and
   a control circuit configured to determine that one of the detected temperatures at one of the locations exceeds a temperature threshold, and in response, adjust one or more of the plurality of switches in proximity with the one location to reduce the power provided to the circuit.

2. The apparatus of claim 1, wherein the control circuit is configured to adjust a resistance of the one or more of the plurality of switches with a predetermined setting to reduce the power provided to the circuit.

3. The apparatus of claim 1, wherein the control circuit is configured to turn off a predetermined number of the one or more of the plurality of switches to reduce the power provided to the circuit.

4. The apparatus of claim 1, wherein the plurality of switches are configured to provide at least one operating voltage in a voltage domain to the circuit, and the control circuit is configured to adjust the one or more of the plurality of switches to reduce one of the at least one operating voltage at the one location.

5. The apparatus of claim 4, wherein the control circuit is configured to adjust the one or more of the plurality of switches to reduce the one of the at least one operating voltage at the one location to an operating voltage threshold in accordance with a predetermined setting.

6. The apparatus of claim 1, wherein the plurality of switches are further arranged as a first set and a second set of unit switches, and wherein the control circuit is configured to operate the first or second set of unit switches.

7. The apparatus of claim 1, wherein the plurality of switches are arranged in parallel.

8. A method for adjusting voltage for thermal mitigation, comprising:
   providing power of a power domain through a plurality of switches;
   detecting a temperature at one location of a plurality of locations exceeding a temperature threshold;
   adjusting one or more of the plurality of switches in proximity with the one location to reduce the power provided, in response to the detecting the temperature exceeding the temperature threshold.

9. The method of claim 8, wherein the adjusting the one or more of the plurality of switches comprises adjusting a resistance of the one or more of the plurality of switches with a predetermined setting to reduce the power provided.

10. The method of claim 8, wherein the adjusting the one or more of the plurality of switches comprises turning off a predetermined number of the one or more of the plurality of switches to reduce the power provided.

11. The method of claim 8, further comprising:
    providing at least one operating voltage in a voltage domain; and
    adjusting the one or more of the plurality of switches to reduce one of the at least one operating voltage at the one location.

12. The method of claim 11, wherein the adjusting the one or more of the plurality of switches to reduce the one of the at least one operating voltage at the one location comprising applying a predetermined setting to the one or more of the plurality of switches to reduce the one of the at least one operating voltage at the one location to an operating voltage threshold.

13. The method of claim 8, further comprising:
    arranging the plurality of switches as a first set or a second set of unit switches; and
    operating the first or second set of unit switches.

14. The method of claim 8, wherein the plurality of switches are arranged in parallel.

15. An apparatus, comprising:
    a first core comprising a first switch coupled to a supply voltage in a voltage domain and configured to provide a first voltage and a second core comprising a second switch coupled to the supply voltage in the voltage domain and configured to provide a second voltage, the first core and the second core sharing a power domain, wherein:
       the first core is configured to operate at the first voltage of the voltage domain, and
       the second core is configured to operate at the second voltage of the voltage domain; and
    a control circuit configured to independently adjust each of the first and second voltages of the voltage domain for thermal mitigation by adjusting the first switch and the second switch, respectively,
    wherein each of the first and second switches comprises a plurality of unit switches, and the control circuit is configured to independently adjust each of the first and second voltages of the voltage domain for thermal mitigation by turning off a number of the plurality of unit switches of the first and second switches, respectively.

16. The apparatus of claim 15, wherein the control circuit is further configured to adjust the first and second voltages to operating voltage thresholds for the first and second cores, respectively.

17. The apparatus of claim 15,
wherein the first core further comprises a first sensor configured to detect a temperature of the first core, and the second core further comprises a second sensor configured to detect a temperature of the second core, and
wherein the control circuit is further configured to determine that the temperature of the first or second cores exceeds a temperature threshold.

18. The apparatus of claim 15, wherein each of the plurality of unit switches of the first and second switches is arranged as a first and a second set of unit switches, and the control circuit is configured to operate the first set or the second set of unit switches.

19. The apparatus of claim 15, wherein each of the plurality of unit switches is arranged in parallel.

20. A method for adjusting voltage for thermal mitigation, comprising:
providing power to a first core and a second core sharing a power domain;
operating the first core at a first voltage of a voltage domain comprising providing the first voltage through a first switch coupled to a supply voltage in the voltage domain;
operating the second core at a second voltage of the voltage domain comprising providing the second voltage through a second switch coupled to the supply voltage in the voltage domain; and
adjusting independently each of the first and second voltages of the voltage domain for thermal mitigation comprising adjusting the first switch and the second switch, respectively,
wherein each of the first and second switches comprises a plurality of unit switches, and the adjusting independently each of the first and second voltages of the voltage domain for thermal mitigation comprises turning off a number of the plurality of unit switches of the first and second switches, respectively.

21. The method of claim 20, wherein the adjusting independently each of the first and second voltages comprises adjusting the first and second voltages to operating voltage thresholds for the first and second cores, respectively.

22. The method of claim 20, further comprising:
detecting a temperature of the first core;
detecting a temperature of the second core; and
determining that the temperature of the first or second cores exceeds a temperature threshold.

23. The method of claim 20, further comprising:
arranging the plurality of unit switches as a first set and a second set of unit switches; and
operating the first set or second set of unit switches.

24. The method of claim 20, wherein each of the plurality of unit switches is arranged in parallel.

* * * * *